(12) United States Patent
Buchanan et al.

(10) Patent No.: US 9,847,128 B2
(45) Date of Patent: Dec. 19, 2017

(54) MEMRISTIVE MEMORY CELL RESISTANCE SWITCH MONITORING

(71) Applicant: Hewlett Packard Enterprise Development LP, Houston, TX (US)

(72) Inventors: Brent Buchanan, Palo Alto, CA (US); Richard James Auletta, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/311,594

(22) PCT Filed: Jun. 20, 2014

(86) PCT No.: PCT/US2014/043445
§ 371 (c)(1),
(2) Date: Nov. 16, 2016

(87) PCT Pub. No.: WO2015/195141
PCT Pub. Date: Dec. 23, 2015

(65) Prior Publication Data
US 2017/0140817 A1    May 18, 2017

(51) Int. Cl.
*G11C 11/00* (2006.01)
*G11C 13/00* (2006.01)

(52) U.S. Cl.
CPC .................. *G11C 13/0059* (2013.01)

(58) Field of Classification Search
CPC .................................................. G11C 13/0059

USPC ....... 365/148, 46, 55, 74, 97, 100, 131, 158, 365/171, 173, 163
See application file for complete search history.

(56) References Cited

U.S. PATENT DOCUMENTS

| | | | |
|---|---|---|---|
| 9,324,421 B2 * | 4/2016 | Perner | G11C 13/0007 |
| 2007/0297221 A1 | 12/2007 | Philipp et al. | |
| 2011/0085370 A1 | 4/2011 | Chen et al. | |
| 2011/0235403 A1 | 9/2011 | Kang | |
| 2012/0057390 A1 * | 3/2012 | Yi | G11C 5/063 365/148 |
| 2013/0235651 A1 * | 9/2013 | Perner | G11C 13/0007 365/148 |
| 2013/0250657 A1 | 9/2013 | Haukness et al. | |
| 2013/0294144 A1 | 11/2013 | Wang et al. | |
| 2014/0056053 A1 | 2/2014 | Ramaswamy et al. | |
| 2014/0082459 A1 | 3/2014 | Li et al. | |
| 2014/0112057 A1 | 4/2014 | Sutardja et al. | |

(Continued)

OTHER PUBLICATIONS

International Searching Authority, The International Search Report and the Written Opinion, dated Feb. 24, 2015, 11 Pages.

(Continued)

*Primary Examiner* — Fernando Hidalgo
(74) *Attorney, Agent, or Firm* — Fabian VanCott

(57) ABSTRACT

In the examples provided herein, a voltage driver module applies an increasing voltage to a memristive memory cell until a resistance of the cell switches to a target resistance. A monitoring module monitors a switching voltage at which the resistance of the cell switches to the target resistance, or an application duration of the increasing voltage to the cell. Additionally, a controller performs an action to protect data stored by the cell upon determining that the switching voltage exceeds a target voltage.

20 Claims, 9 Drawing Sheets

(56) References Cited

U.S. PATENT DOCUMENTS

2014/0115296 A1\* 4/2014 Diep .................. G11C 13/0028
 711/206
2017/0062048 A1\* 3/2017 Ge ..................... G11C 13/0002

OTHER PUBLICATIONS

Yang, C. et al., Improving Reliability of Non-volatile Memory Technologies Through Circuit Level Techniques and Error Control Coding, EURASIP Journal on Advances in Signal Processing 2012 2012:211 24 pages.

\* cited by examiner

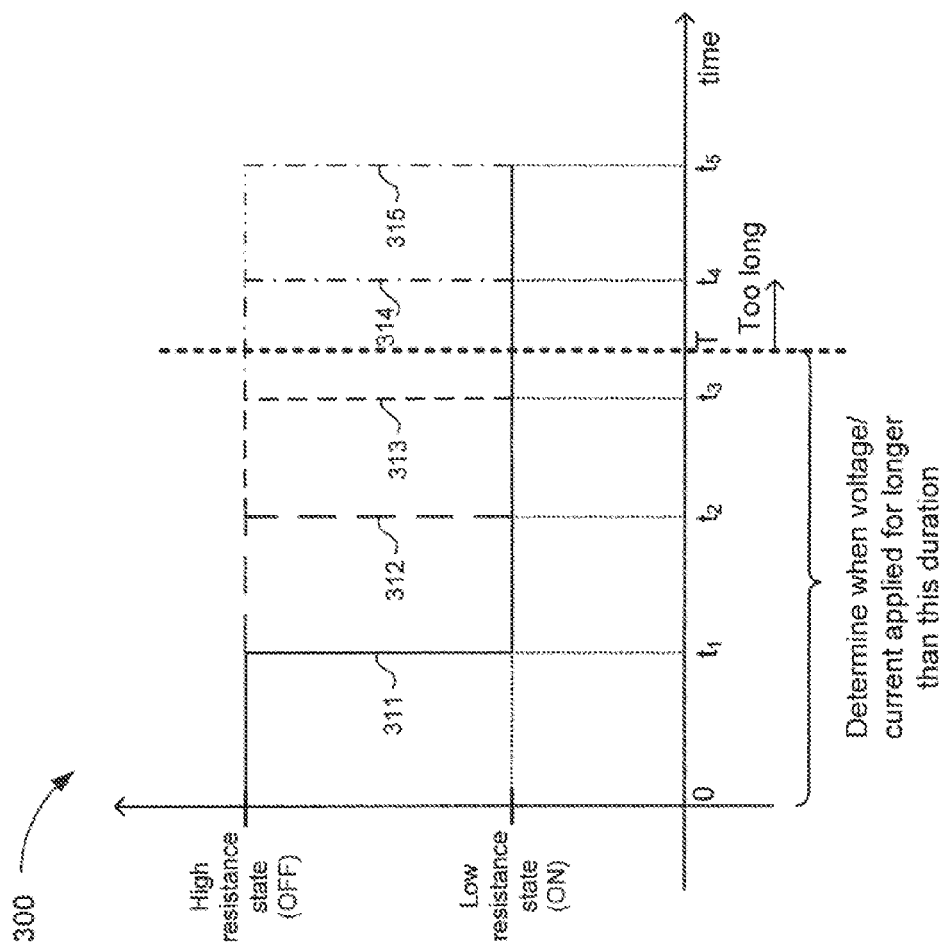

MEMRISTIVE MEMORY CELL RESISTANCE SWITCH MONITORING

BACKGROUND

A resistive random access memory (RRAM) cell is a type of non-volatile memory that changes its resistive state after sufficient voltage or current has been applied to the cell. The RRAM cell switches between a low resistive state (LRS) and a high resistive state (HRS). In multi-level cells (MLC), more than two storage states can exist. With a bipolar RRAM, when voltage is applied to the cell in one direction, the cell is set to a LRS, and when voltage is applied to the cell in the opposite direction, the cell is set to HRS. With a unipolar RRAM, when voltage of a first magnitude is applied to the cell, the cell is set to a LRS, and when voltage of a second, different magnitude is applied to the cell in the same direction, the cell is set to a HRS.

BRIEF DESCRIPTION OF THE DRAWINGS

The accompanying drawings illustrate various examples of the principles described below The examples and drawings are illustrative rather than limiting.

FIG. 3 depicts a graph of resistance states as a function of time of example memristive memory cells.

DETAILED DESCRIPTION

RRAM cells have a limited lifetime. Although aggregate statistics can be used to predict the general usable lifetime of as cell, an individual cell can have a lifetime that is several deviations from the aggregate lifetime mean. As a cell wears out, some failure mechanisms may cause the cell to have difficulty reaching a target resistance. It would be useful to detect when the operation of a cell has degraded to the point where the cell is approaching the end of its useful life so that actions can be taken to protect the data stored by the cell.

The techniques presented below permit the health of a memristive memory cell to be monitored. The voltage or current needed to be applied to a memristive memory cell to cause the cell to switch to a target resistance is monitored to determine whether it exceeds a predetermined threshold. Alternatively, the duration for which the applied voltage or current is needed to be applied to the cell can also be used as an indicator of cell health.

One type of RRAM cell is a memristive memory cell. A memristive memory cell switches between two or more states, a low resistance state and a high resistance state, and additional intermediate states in the case of MLC, and remains in the switched resistance state until subsequent switching is triggered by the application of a switching voltage or current. Because the memristive memory cell retains its state, it is considered a non-volatile memory.

Figure 1:
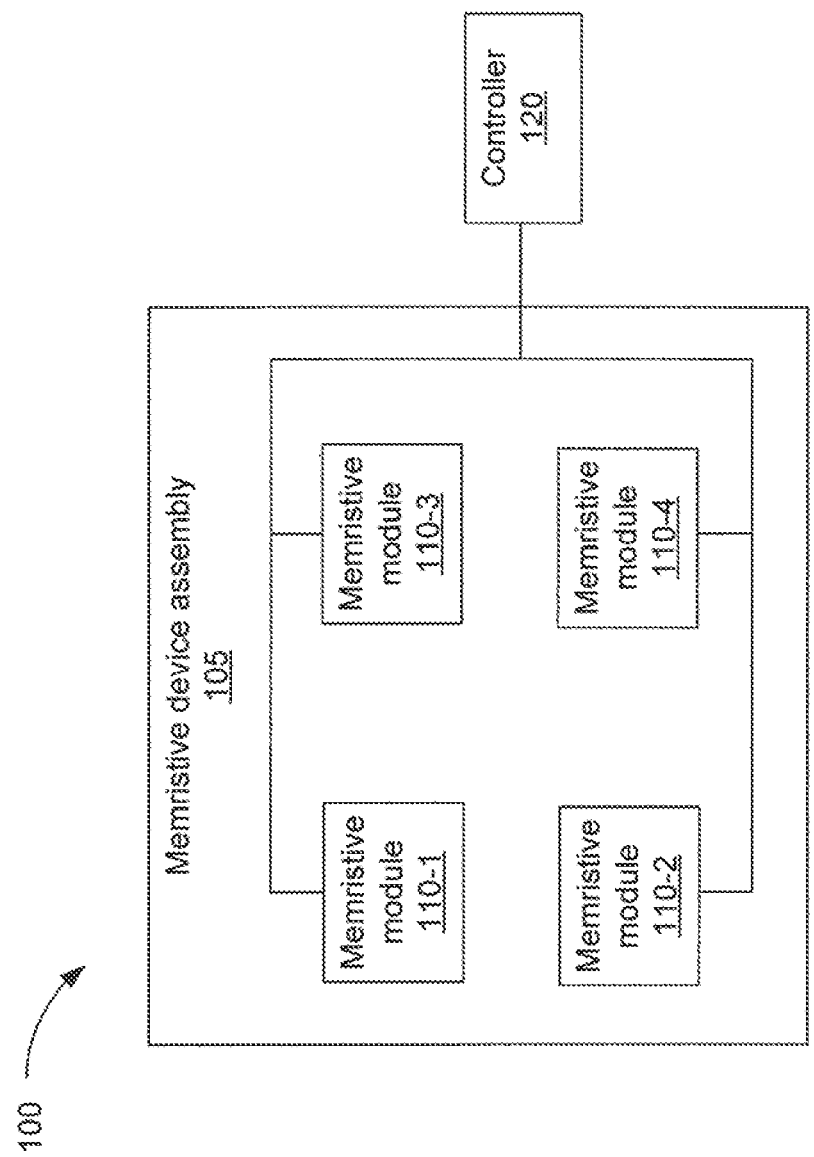
FIG. 1 depicts a block diagram of an example system including a memristive device assembly and a controller.

FIG. 1 depicts a block diagram of an example system 100 including a memristive device assembly 105 and a controller 120. The memristive device assembly 105 can include any number of memristive modules 110-1, 110-2, 110-3, 110-4. In some configurations, such as shown in the example of FIG. 1, the memristive modules 110-1, 110-2, 110-3, 110-4 can be arranged in rows and columns of an array.

The controller 120 can receive control signals from an external computing device or from stored instructions. The controller 120 can execute the received control signals to send a voltage or current of a specified magnitude and/or waveform to a specific memristive module 110 to switch the resistance of a memristive memory cell within the memristive module 110. The controller 120 can also receive from the memristive modules 110 a monitored switching voltage, switching current, or duration for which a voltage or current has been applied to trigger the memristive memory cell to changed resistance.

Figure 2:
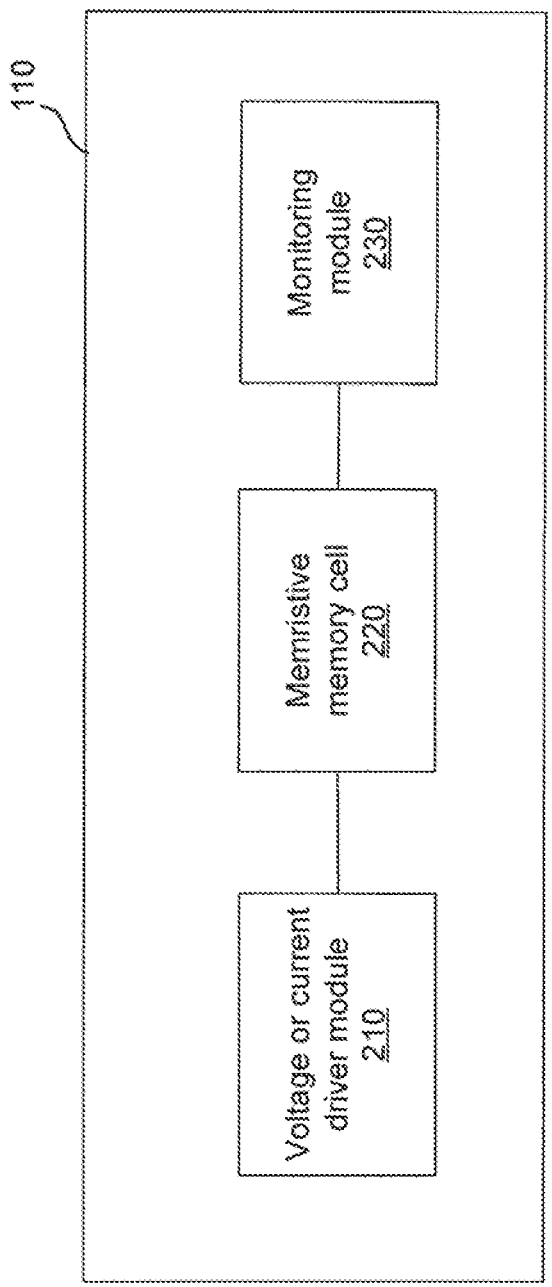
FIG. 2 depicts a block diagram of an example memristive module.

As shown in the example of FIG. 2, each memristive module 110 can include a voltage or current driver module 210, a memristive memory cell 220, and a monitoring module 230. Each memristive module 110 can also include other components and perform other functions.

The voltage or current driver 210 is directed by the controller 210 to provide a voltage or current to the memristive memory cell 220 to cause the memristive memory cell 220 to switch states. When a voltage is applied to a memristive memory cell 220, the duration of application of the voltage needed to cause the memristive memory cell 220 to switch resistance states depends upon the magnitude of the applied voltage. For example, a voltage pulse of approximately 2 volts applied for approximately 1 µs can cause the memristive memory cell 220 to switch from a high resistance state corresponding to an off state to a low resistance state corresponding to an on state, while a voltage pulse of approximately 1 volt needs to be applied longer, approximately 100 µs, to trigger the same switching. Thus, the lower the voltage, the longer the voltage needs to be applied to the memristive memory cell to cause the memristive memory cell to change state. Similarly, when a current is applied to a memristive memory cell, the duration needed to cause the memristive memory cell to switch resistance states is dependent upon the magnitude of the applied current.

Individual memristive memory cells can have significantly different, switching voltage and switching current as well as switching times because of variations in cells, for example, the LRS is not uniform among cells. Further, system noise, distance of the cell from the pulse driver, and other non-idealities can lead to the cells in a memristive device assembly to undergo the application of a different pulse voltage when switched.

Additionally, when small increases in voltage are applied to a memristive memory cell, the switching time of the cell is typically exponentially shortened, and a steady increase in voltage corresponds to a rapidly decreasing switching time. Consequently, by applying an increasing voltage or current ramp to memristive memory cells, a memristive memory cell that is slower to respond in switching resistive states can be triggered to switch faster than with the application of a constant voltage or current. Thus, if a particular device has a higher switching voltage, it can be triggered to switch within a maximum time period by increasing the applied voltage or current to a maximum level within that time period. Also, only subjecting memory cells that can benefit from the higher voltages avoids exposing other memory cells to excessive voltages that could degrade their lifetimes.

If there is a problem with a memristive memory cell, the voltage or current needed to be applied to switch the problematic memristive memory cell will be higher than a threshold level that can be predetermined. Consequently, the application of a high voltage or current to cause switching to occur in a memristive memory cell is indicative that the memristive memory cell may have entered a failure mode, may not be operating reliably due to age, may be having other problems, and/or may be approaching an end-of-life. The predetermined threshold level may vary for different types of memristive memory cells, for example, memristive memory cell's that use different types of material between the cell's electrodes may be assigned a different switching voltage and switching current.

If an increasing voltage or current is applied to the memristive memory cell, and the applied voltage or current needed for switching is beyond the predetermined threshold, the duration for which the increasing voltage or current is applied can also be used as an indicator of poor health of the memristive memory cell. For example, if the increasing voltage is a linearly increasing voltage ramp, the duration of application of the voltage can be used as an indicator of health because the duration it takes to reach a switching voltage is determinable. If the increasing voltage is not linear, but is a known non-linear function, a duration that is a function of applied voltage can be derived so that duration can still be used as an indicator of memristive memory cell health. Similarly, the duration of an applied current an be used as an indicator memristive memory cell health.

The voltage or current driver module 210 shown in the example of FIG. 2 can be directed by the controller 120 to generate a particular repeatable waveform having a linearly or non-linearly increasing voltage or current. For example, the voltage driver module 210 can be made to generate a linearly increasing voltage ramp.

Then the monitoring module 230 can monitor one of several parameters to determine whether a particular memristive memory cell is having problems. The monitoring module 230 can monitor the applied voltage and/or current at which the memristive memory cell switches resistance states. Alternatively or additionally, the monitoring module 230 can monitor a duration for which a voltage or current is applied to cause resistance switching.

FIG. 3 depicts a graph of resistance states as a function of time for five example memristive memory cells. For a given applied voltage, for example, a linearly increasing voltage ramp, the curve 311 corresponding to a first example memristive device switches from a high resistance state (off state) to a low resistance state (on state) at time $t_1$; the curve 312 corresponding to a second example memristive device switches resistive states at a longer time $t_2$; and the curve 313 corresponding to a third example memristive device switches resistive states at a yet longer time $t_3$. Each of the curves 311, 312, and 313 have a switching time that is less than a time duration T corresponding to a predetermined threshold that indicates that the memristive memory cell is problematic.

The curve 314 corresponding to a fourth memristive device switches resistive states at a time $t_4$; and the curve 315 corresponding to a fifth memristive device switches resistive states at a longer time $t_5$. Curves 314 and 315 each have a switching time that is longer than the time duration T. Thus, the long switching time is indicative that the memristive memory cells corresponding to these curves are problematic and not expected to function reliably.

Figure 4A:
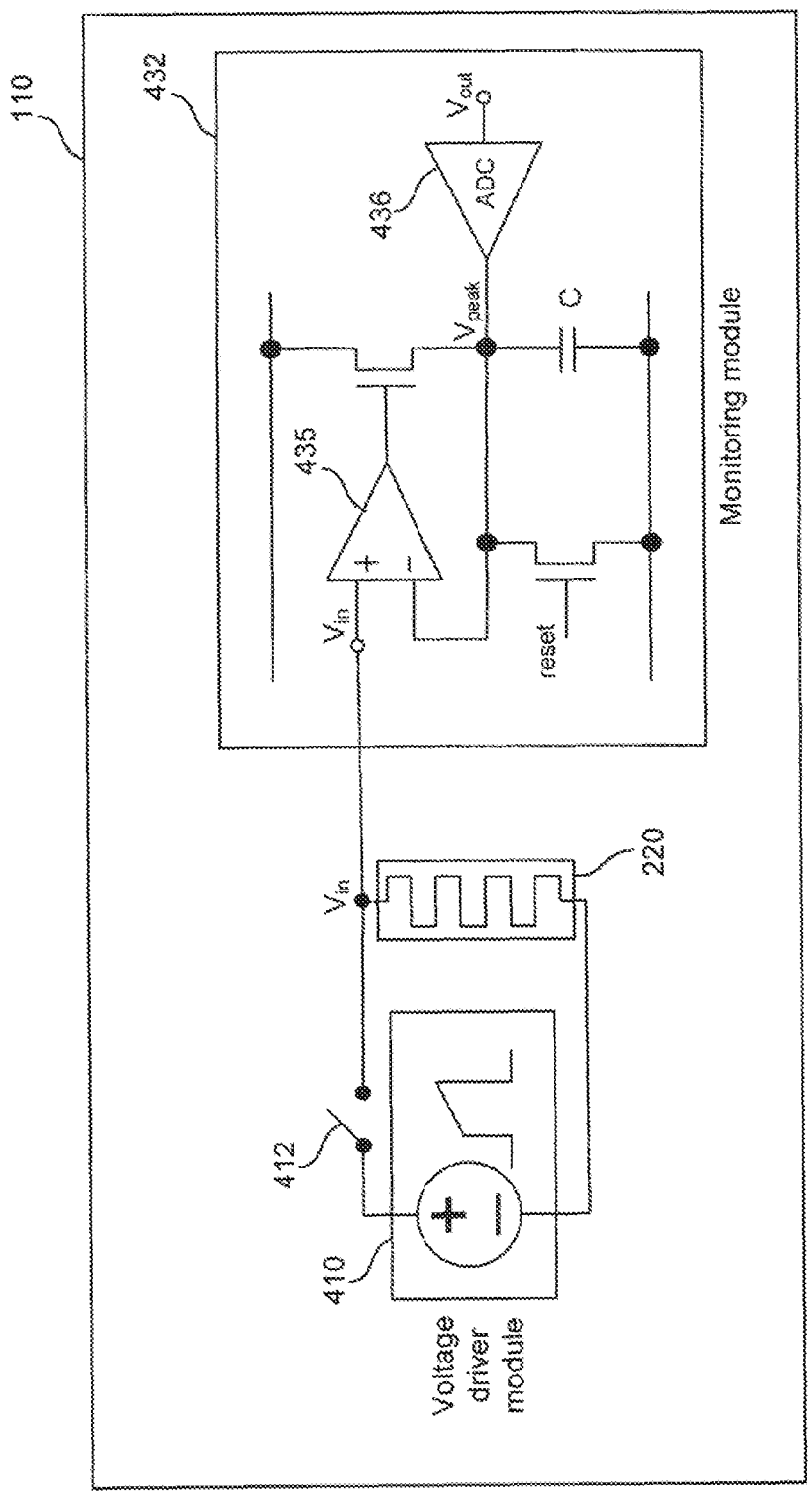
FIGS. 4A and 4B depict circuit diagrams of example systems ding a voltage driver module for monitoring the health of a memristive memory cell.
Figure 4B:
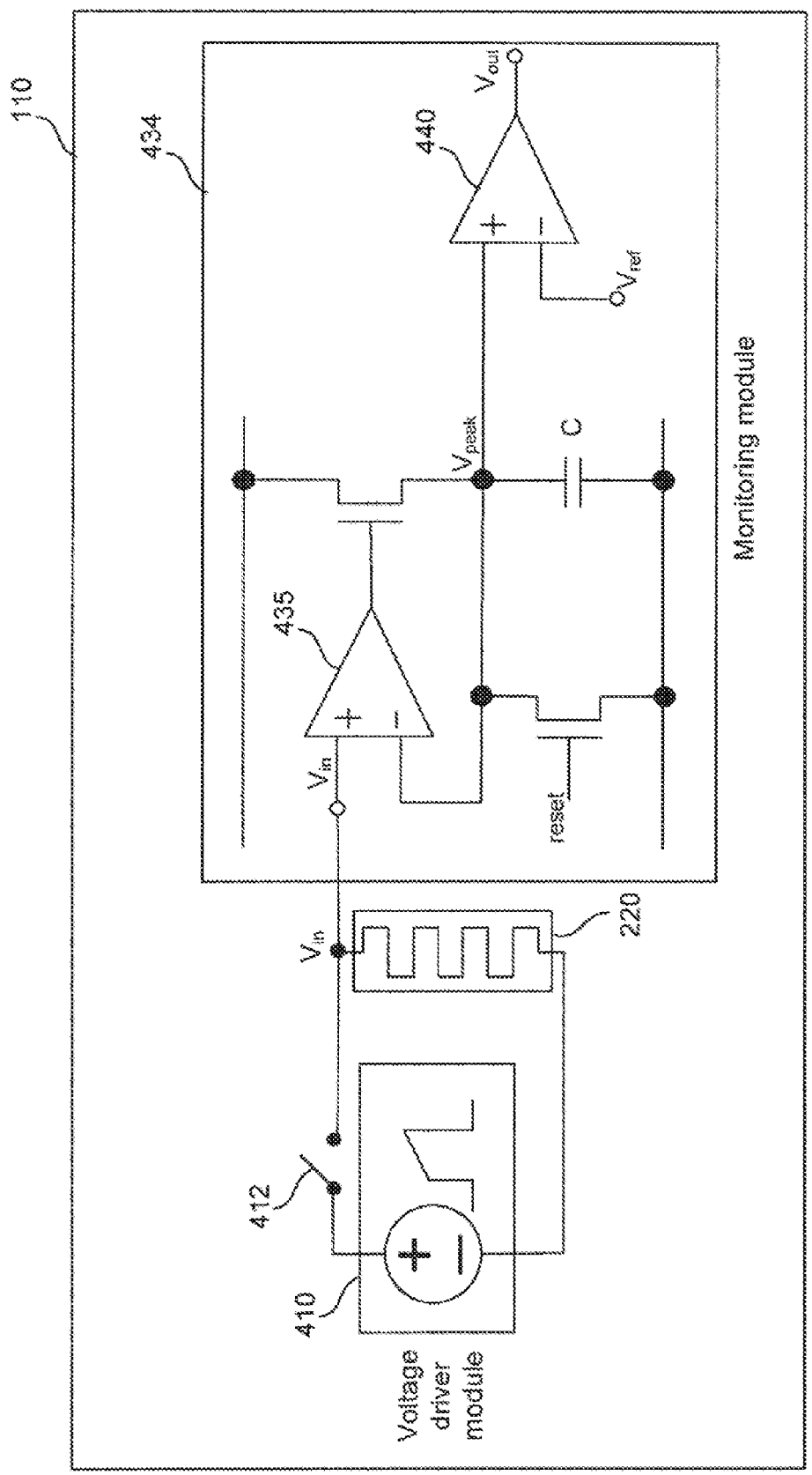

Several circuits that can be used to monitor the applied voltage or current levels and the duration of applied voltage or current are described below. FIGS. 4A and 4B depict circuit diagrams of example systems including a voltage driver module for monitoring the health of a memristive memory cell.

In the example of FIG. 4A, the voltage driver module 410 generates a linearly increasing voltage ramp that is applied to memristive memory cell 220 when switch 412 is closed. Not shown in the figure is a circuit that determines when the memristive memory cell 220 has switched resistance states and triggers the switch 412 to open and the voltage driver module 410 to stop generating the voltage ramp.

The monitoring module 432 monitors the voltage $V_{in}$ applied to the memristive memory cell 220. The capacitor C stores the present peak voltage $V_{peak}$, and the present peak voltage is set to zero when 'reset' is selected. If the applied voltage is greater than the stored peak voltage, the output of the operational amplifier 435 is positive until the capacitor C charges up to a new peak value. The analog to digital converter 436 converts the peak voltage stored by the capacitor C to a digital value, and the monitoring, module 432 outputs the digitized peak voltage. The output of the monitoring module 432 is then sent to the controller 120, and the controller can determine whether the voltage applied to the memristive memory cell 220 has exceeded a predetermined threshold voltage value.

In the example of FIG. 4B, the voltage driver module 410 again generates a linearly increasing voltage ramp that is applied to memristive memory cell 220 when switch 412 is closed. The monitoring module 434 monitors the voltage $V_{in}$ applied to the memristive memory cell 220 in the same manner as the monitoring module 432 shown in the example of FIG. 4B. However this case, the monitoring module 434 uses a comparator 440 to compare the peak stored voltage $V_{peak}$ to a reference voltage $V_{ref}$ where the reference voltage is the predetermined threshold voltage value. An output voltage value of one is sent to the controller 120 when the peak voltage is greater than the reference voltage, otherwise, the output voltage value of zero is sent to the controller 120.

Figure 5A:
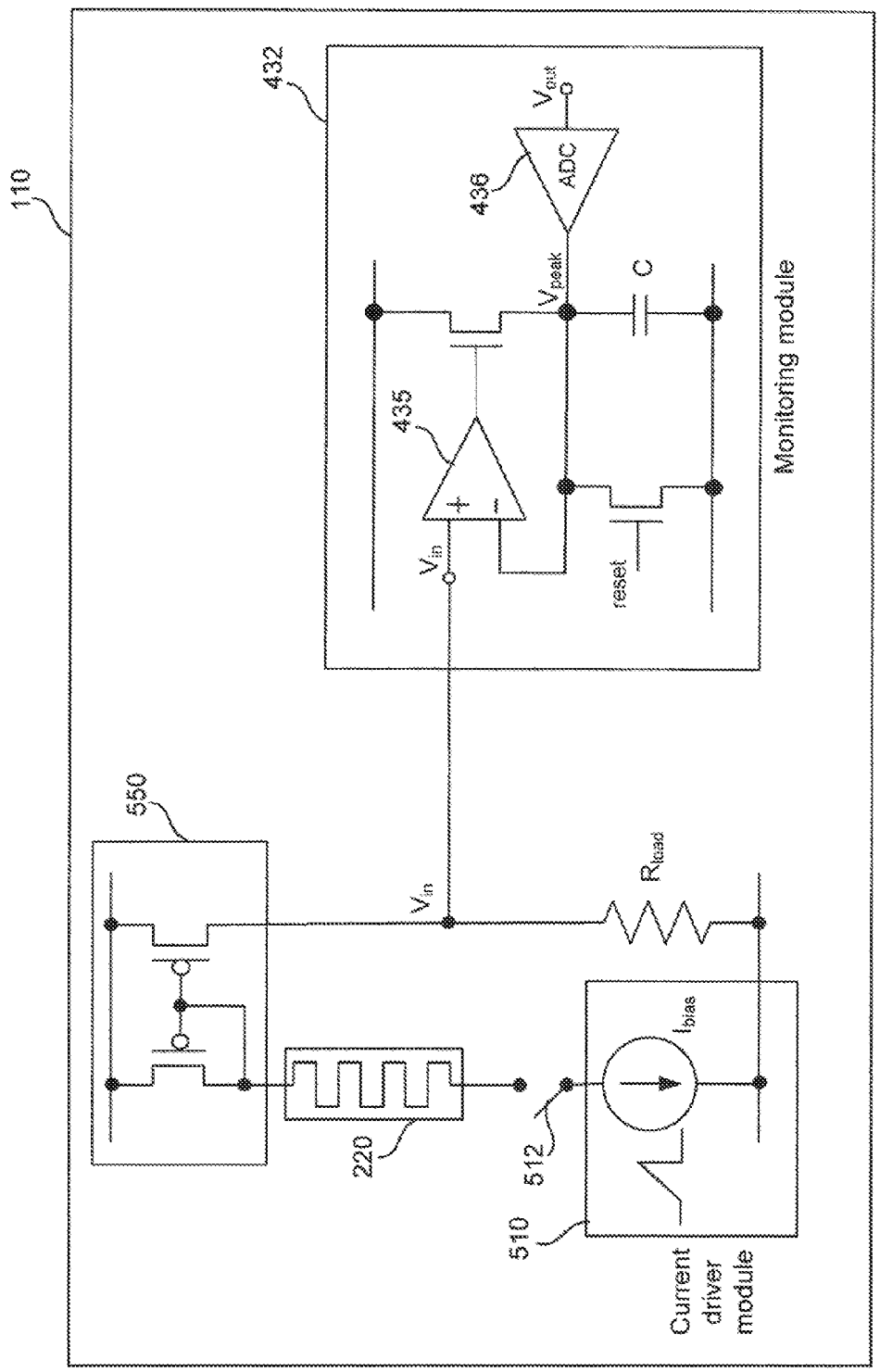
FIGS. 5A and 5B depict circuit diagrams of example systems including a current driver module for monitoring the health of a memristive memory cell (FIG. 5A) and a time-to-voltage converter for measuring pulse duration (FIG. 5B).
Figure 5B:
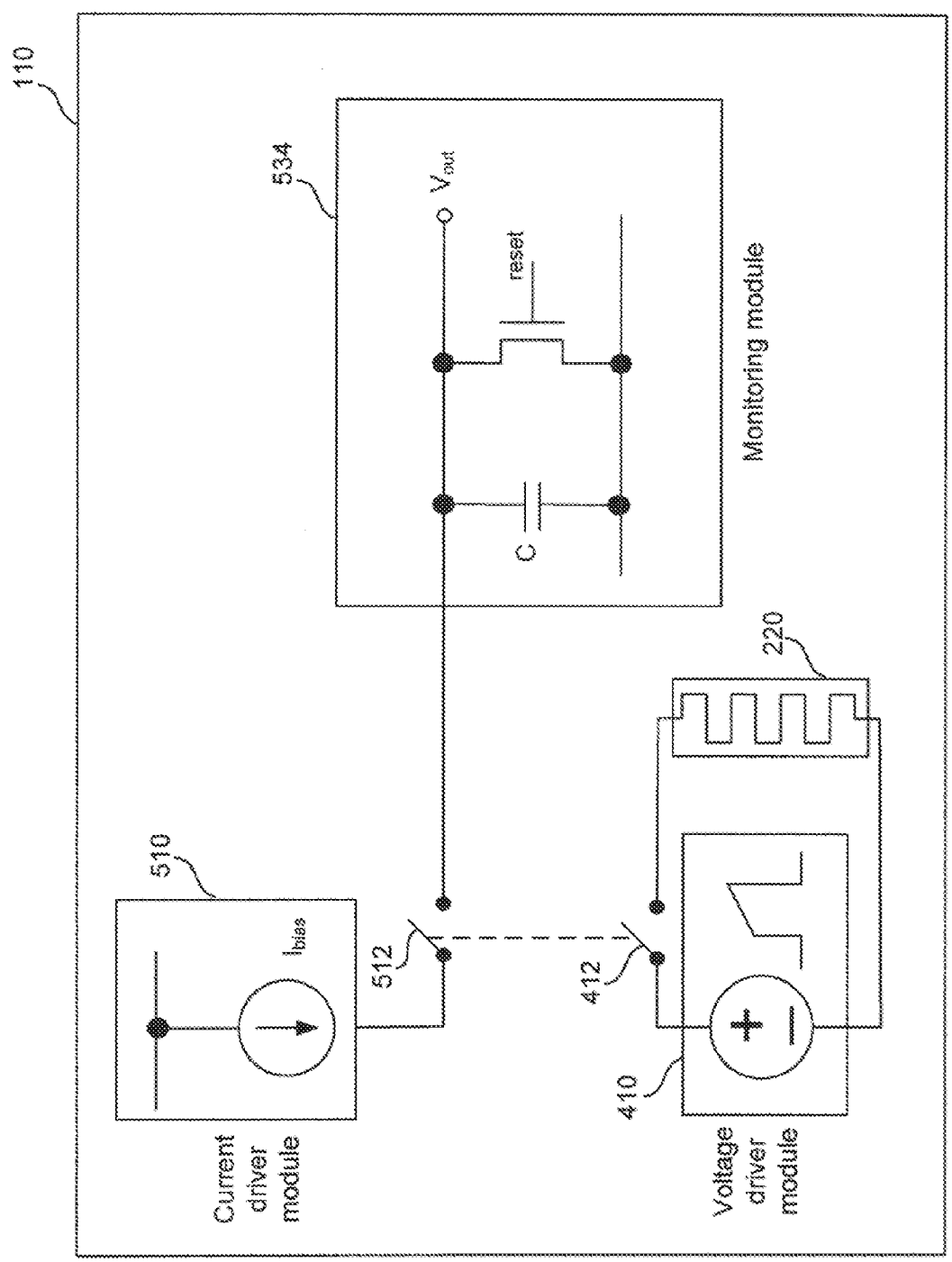

FIGS. 5A and 5B depict circuit diagrams of example systems including a current driver module for monitoring the health of a memristive memory cell (FIG. 5A) and a time-to-voltage converter for measuring pulse duration (FIG. 5B).

In the example of FIG. 5A, the current driver module 510 generates a nearly it creating bias current ramp that is driven into the memristive memory cell 220 when switch 512 is closed. Not shown in the figure is a circuit that determines when the memristive memory cell 220 has switched resistance states and triggers the switch 512 to open and the current driver module 510 to stop generating the bias current ramp.

The current passing through the memristive memory cell 220 is mirrored by circuit 550 and driven through load resistor $R_{load}$. Thus, the voltage $V_{in}$ across the load resistor is proportional to the current in the memristive memory cell 220. The peak load resistor voltage is monitored by monitoring module 432, as described above, and the output of the monitoring module 432 is sent to the controller 120.

In the example of FIG. 5B, the voltage driver module 410 generates a linearly increasing voltage ramp that is applied to memristive memory cell 220 when switch 412 is closed. Not shown in the figure is a circuit that determines when the memristive memory cell 220 has switched resistance states and triggers the switch 412 to open and the voltage driver module 410 to stop generating the voltage ramp.

Current driver module 510 generates a bias current. Switch 412 and switch 512 are coupled so that when switch 412 is open, switch 512 is also open, and when switch 412 is closed, switch 512 is also closed. Switch 512 controls when the generated bias current from the current driver module 510 flows.

Within monitoring module 534, the voltage $V_{out}$ across capacitor C is set to zero when reset is selected. Monitoring module 534 then integrates the bias current over time so that the output voltage $V_{out}$ is proportional to the duration that the voltage ramp generated by voltage driver module 410 is applied to the memristive memory cell 220 when switches 412, 512 are closed. The output of the monitoring module 534 is sent to the controller 120.

Figure 6:
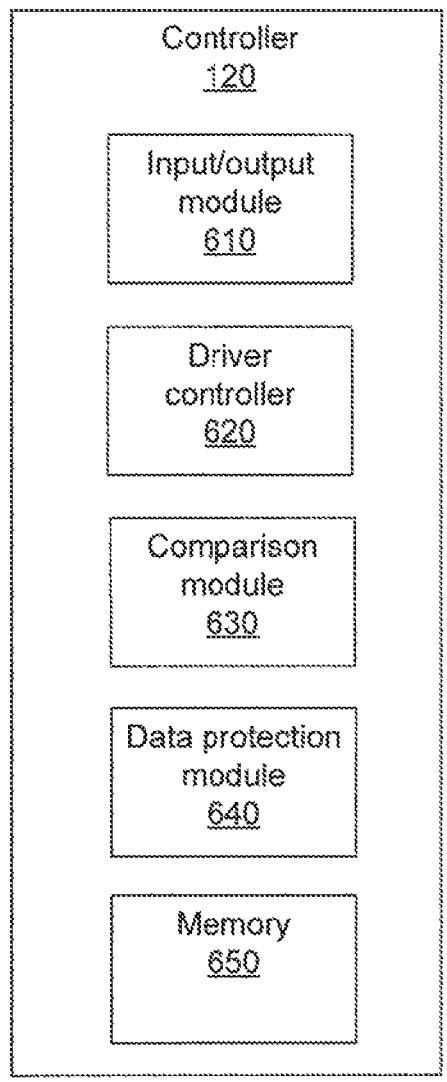
FIG. 6 depicts a block diagram of an example controller used to monitor the health of a memristive memory cell and protect data stored by the memory cell.

FIG. 6 depicts a block diagram of an example controller 120 used to monitor the health of a memristive memory cell and protect data stored by the memory cell. The controller 120 can include an input/output module 610, a driver controller 620, comparison module 630, a data protection module 640, and a memory 650. The controller can also have more modules and perform other functions.

The input/output module 610 receives, external control signals, for example, from a processor, or a user. The input/output module 610 can also transmit a message to the processor or user, either in response to the external control signals, or independently of any external signals.

The driver controller 620 transmits signals to the voltage or current driver modules 210 to generate a voltage or current waveform to change the resistance states of the memristive memory cells. Additionally, the driver controller module 620 stops generating the driving voltage or current upon receiving information from a monitoring module 230 that a memristive memory cell has switched resistance states.

The comparison module 630 receives information from the monitoring module 230; the information can include the voltage or current level at which switching, of a memristive memory cell has occurred, or the duration for which a voltage or current was applied to a memristive memory cell before switching occurred. The comparison module 630 then compares the received switching voltage, current, or duration with the threshold voltage, current, or duration value to determine whether the switching voltage, current, or duration has exceeded predetermined threshold.

If the received value exceeds the corresponding threshold value, the data protection module 640 performs one or more actions to safeguard the data currently stored by the problematic memristive memory cell, such as, moving or copying the data stored by that memristive memory cell to another storage device, for example, a memristive memory cell in the same memristive device array or another array, or a different type of storage device altogether; performing further monitoring of the memristive memory cell; and/or identifying the memristive memory cell as unreliable for subsequent data storage.

With further monitoring of a memristive memory cell, the cell's switching voltage, current, or duration is monitored to see if it increases. Upon detecting a subsequent increase, the data stored in the memory cell is moved or copied to another storage location, and it is identified as unreliable for further use.

When a memristive memory cell is identified as unreliable for use, its identifier is stored in memory 650 so that the memory cell is not subsequently used for storage. Additionally, predetermined threshold values for switching voltage, current, and duration for each memristive memory cell can be stored in memory 650.

Figure 7:
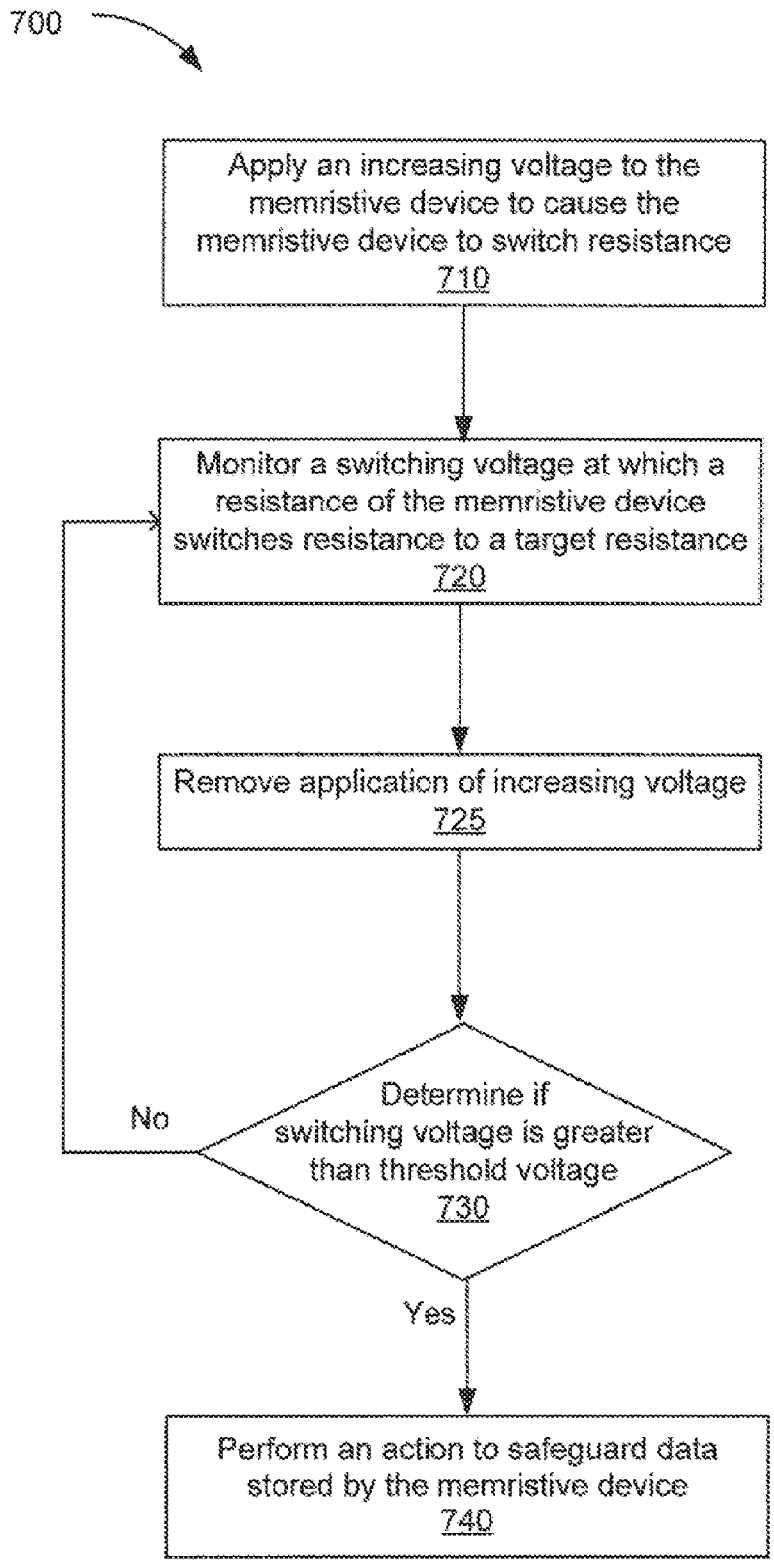
FIG. 7 depicts a flow diagram illustrating an example process of monitoring the health of a memristive memory cell.

FIG. 7 depicts a flow diagram illustrating an example process 700 of monitoring the health of a memristive device, such as a memristive memory cell.

At block 710, the controller applies an increasing voltage to a memristive device to cause the memristive device to switch resistance states. The increasing voltage can be a linearly or nonlinearly increasing voltage, as long as the increasing voltage is a known and repeatable function.

Then at block 720, the controller monitors a switching voltage at which the resistance of the memristive device switches resistance to a target resistance. The target resistance is the known resistance state to which the memristive device is to switch for a particular on or off state.

Next, at block 725, the controller removes the application of the increasing voltage when the memristive device has switched to the target resistance.

At decision block 730, the controller determines whether the switching voltage is greater than a threshold voltage. The threshold voltage is predetermined for the particular type of memristive device being monitored in the memristive device assembly. If the switching voltage is not greater than the threshold voltage (block 730—No), the process returns to block 720.

If the switching voltage is greater than the threshold voltage (block 730—Yes), at block 740, the controller performs an action to safeguard the data stored by the memristive device. Non-limiting examples of actions for safeguarding the data can include moving or copying data stored by the problematic memristive device to a different memristive device; performing further monitoring of the memristive device, for example, to determine whether the switching, voltage or duration increases; and identifying the memristive device as unreliable for storing data so that the memristive device is no longer used for data storage.

In a similar manner, the controller can apply an increasing current to the memristive device at block 710, monitor a switching current at which resistance of the memristive device switches resistance at block 720, remove application of the increasing current at block 725, and determine if the switching current is greater than a threshold current at block 730.

The example process 700 of monitoring the health of a memristive device allows the system to take preventive measures in advance of outright cell failure and prevent the loss of data stored by the failed cell.

What is claimed is:

1. An apparatus comprising:
 a memristive memory cell;
 a voltage driver module to apply an increasing voltage to the memristive memory cell until a resistance of the memristive memory cell switches to a target resistance;
 a monitoring module to monitor a switching voltage at which the resistance of the memristive memory cell switches to the target resistance, or an application duration of the increasing voltage to the memristive memory cell to cause the memristive memory cell to switch to the target resistance; and
 a controller to perform an action to protect data stored by the memristive memory cell upon the memristive device is approaching an end of useful life by determining that the switching voltage exceeds a target voltage or the application duration exceeds a target duration.

2. The apparatus of claim 1, wherein the action includes moving or copying data stored by the memristive memory cell to another storage device.

3. The apparatus of claim 1, wherein the action includes performing further monitoring of the memristive memory cell.

4. The apparatus of claim 3, wherein further monitoring includes determining whether a subsequent switching voltage of the memristive memory cell increases beyond the target voltage.

5. The apparatus of claim 1, wherein the action includes identifying the memristive memory cell as an unreliable data storage device so that the controller avoids subsequent use of that memristive memory cell for data storage.

6. An apparatus comprising:
a first memristive memory cell;
a current driver module to apply an increasing current ramp to the first memristive memory cell until a resistance of the first memristive memory cell switches to a target resistance;
a monitoring module to monitor a switching current at which the resistance of the first memristive memory cell switches to the target resistance, or an application duration for which the increasing current ramp is applied to the first memristive memory cell to cause the first memristive memory cell to switch to the target resistance; and
a controller to execute a response to protect data stored by the first memristive memory cell upon determining the memristive device is approaching an end of useful life by determining that the switching current exceeds a target current or the application duration exceeds a target duration.

7. The apparatus of claim 6, wherein the response includes moving or copying data stored by the first memristive memory cell to another storage device.

8. The apparatus of claim 6, wherein the response includes performing further monitoring of the first memristive memory cell.

9. The apparatus of claim 6, wherein the response includes identifying the memristive memory cell as an unreliable data storage device so that the controller avoids subsequent use of that memristive memory cell for data storage.

10. The apparatus of claim 6, wherein the first memristive memory cell is one of a plurality of memristive memory cells in a memory cell array, and further wherein the controller executes responses to protect data stored by the plurality of memristive memory cells.

11. A method comprising:
applying an increasing voltage to a memristive device to cause the memristive device to switch resistance;
monitoring a switching voltage at which a resistance of the memristive device switches resistance to a target resistance;
determining when the memristive device is approaching an end of useful life by determining when the switching voltage exceeds a threshold voltage; and
upon determining that the switching voltage exceeds a threshold voltage, performing an action to safeguard data stored by the memristive device.

12. The method of claim 11, further comprising removing the applied increasing voltage when the resistance of the memristive device switches to the target resistance.

13. The method of claim 11, wherein the action comprises moving or copying data stored by the memristive device to a different storage device.

14. The method of claim 11, wherein the action comprises identifying the memristive device as an unsuitable data storage device so that subsequent use of that memristive memory cell for data storage is avoided.

15. The method of claim 11, wherein the action comprises performing further monitoring on the memristive device.

16. The apparatus of claim 1, monitoring module to determine when the resistance at which the memristive memory cell switches to the target resistance exceeds the target voltage as an indication that the memristive memory cell is unreliable for further data storage.

17. The apparatus of claim 1, wherein the monitoring module is to determine when the duration of application of the increasing voltage exceeds the target duration as an indication that the memristive memory cell is unreliable for further data storage.

18. The apparatus of claim 16, wherein the monitoring module comprises a capacitor to charge to a peak voltage applied to the memristive memory cell.

19. The apparatus of claim 16, wherein the monitoring module comprises a comparator to compare a peak voltage applied to the memristive memory cell to the target voltage.

20. The apparatus of claim 17, wherein the monitoring module is to integrate a bias current over time to generate an output voltage that is proportional to the duration during which the increasing voltage is applied to the memristive memory cell.

* * * * *